United States Patent [19]

Bearinger et al.

[11] Patent Number: 5,807,611
[45] Date of Patent: Sep. 15, 1998

[54] ELECTRONIC COATINGS

[75] Inventors: Clayton R. Bearinger; Robert Charles Camilletti; Loren Andrew Haluska; Keith Winton Michael, all of Midland, Mich.

[73] Assignee: Dow Corning Corporation, Midland, Mich.

[21] Appl. No.: 725,718

[22] Filed: Oct. 4, 1996

[51] Int. Cl.$^6$ ....................................................... B05D 3/02
[52] U.S. Cl. ...................... 427/374.7; 428/450; 428/446; 428/697; 428/689; 427/376.2; 427/376.3; 427/226; 427/228; 427/58; 427/126.2; 501/88; 501/97; 501/96; 501/60; 501/65
[58] Field of Search ............................... 427/374.7, 376.2, 427/376.3, 226, 228, 58, 126.2; 428/450, 446, 697, 698; 501/88, 97, 96, 60, 65

[56] References Cited

U.S. PATENT DOCUMENTS

| | | | |
|---|---|---|---|
| 3,615,272 | 10/1971 | Collins | 23/366 |
| 4,340,619 | 7/1982 | Gaul, Jr. | 427/288 |
| 4,363,832 | 12/1982 | Odawara | 427/183 |
| 4,540,803 | 9/1985 | Cowdery et al. | 198/465.1 |
| 4,753,855 | 6/1988 | Haluska et al. | 428/702 |
| 4,910,173 | 3/1990 | Niebylski | 501/97 |
| 4,973,526 | 11/1990 | Haluska | 428/697 |
| 4,999,397 | 3/1991 | Weiss et al. | 524/755 |
| 5,010,159 | 4/1991 | Bank et al. | 528/23 |
| 5,063,267 | 11/1991 | Hanneman et al. | 524/284 |
| 5,258,334 | 11/1993 | Lantz, II | 437/238 |
| 5,387,480 | 2/1995 | Haluska et al. | 428/698 |
| 5,399,441 | 3/1995 | Bearinger et al. | 428/689 |
| 5,416,190 | 5/1995 | Mine et al. | 528/492 |
| 5,436,083 | 7/1995 | Haluska et al. | 428/688 |
| 5,436,084 | 7/1995 | Haluska et al. | 428/688 |
| 5,458,912 | 10/1995 | Camilletti et al. | 427/126.4 |
| 5,492,958 | 2/1996 | Haluska et al. | 524/439 |
| 5,508,238 | 4/1996 | Zank | 501/87 |

FOREIGN PATENT DOCUMENTS

| | | | |
|---|---|---|---|
| 0615000A1 | 2/1994 | European Pat. Off. | C23C 18/12 |
| 63107122 | of 0000 | Japan . | |
| 59-178749 | 3/1983 | Japan . | |

*Primary Examiner*—Margaret W. Glass
*Attorney, Agent, or Firm*—Sharon K. Severance

[57] ABSTRACT

The present invention relates to a ceramic coating composition comprising a preceramic material such as silicon oxide precursors, silicon carbonitride precursors, silicon carbide precursors, and silicon nitride precursors and a flux material such as $B_2O_3$, $PbO_2$, $P_2O_5$, and $Bi_2O_3$. The present invention also relates to a substrate such as an electronic device having said coating applied and ceramified thereon.

14 Claims, No Drawings

ELECTRONIC COATINGS

BACKGROUND OF THE INVENTION

This invention pertains to a tamper proof electronic device coating. The coating is applied to an integrated circuit device chip at the wafer fabrication stage. The use of a flux material in combination with a ceramic precursor produces a coating that has improved abrasion resistance and toughness.

The dissection of electronic devices is a major source of information for both commercial competitors as well as foreign governments. The devices may be analyzed by numerous techniques such as x-rays, cross-sectioning, etching and others. Because of the ability to analyze the devices it has become desirable to make the electronic devices resistant to the numerous analytical techniques.

The use of certain fillers to improve the tamper-proof characteristics of electronic coatings is known in the art. For example, U.S. Pat. No. 5,258,334 to Lantz, II, U.S. Pat. No. 5,399,441 to Bearinger et al., U.S. Pat. No. 5,387,480 to Haluska et al., U.S. Pat. No. 5,436,083 to Haluska et al., U.S. Pat. No. 5,436,084 to Haluska et al., U.S. Pat. No. 5,458,912 to Camilletti et al., U.S. Pat. No. 5,492,958 to Haluska et al. and EP 0615000 all disclose coating compositions comprising a filler and a silica precursor resin, a borosilazane or a polysilazane. The fillers disclosed in the above patents impart a variety of properties to the coating such as opaqueness, radiopaqueness, or resistance to plasma etching, wet etching or cross-sectioning. However, these patents do not specifically teach fillers which improve the abrasion resistance and toughness of the coatings.

It is therefore an object of the instant invention to provide a tamper-proof electronic coating comprising a flux material in a preceramic material.

SUMMARY OF THE INVENTION

This invention relates to a coating composition comprising a flux material in a preceramic material wherein said coating is applied to a substrate, preferably an electronic device, and pyrolyzed to form a ceramic coating on at least one surface of the electronic device. This invention also relates to an electronic device having said coating applied and ceramified thereon.

THE INVENTION

This invention relates to a ceramic coatings which are useful as coatings for electronic devices. By electronic device it is meant to include silicon based devices, gallium arsenide based devices, focal plane arrays, opto-electronic devices, photovoltaic cells and optical devices. The coating may be applied to other substrate where the tamper proof characteristic provided by the coating is desired.

The preceramic materials useful in this invention include, but are not limited to silicon oxide precursors, silicon carbonitride precursors, silicon carbide precursors and silicon nitride precursors.

The preferred preceramic materials to be used in the process of this invention are precursors to silicon oxides, especially silica. Such silicon oxide precursors include, but are not limited to, hydrogen silsesquioxane resin (H-resin); hydrolyzed or partially hydrolyzed products of compounds or mixtures of compounds of the formula $R^1{}_n Si(OR^1)_{4-n}$; or combinations of the above, in which each $R^1$ is independently an aliphatic, alicyclic or aromatic substituent of 1–20 carbon atoms, preferably 1–4, such as an alkyl (e.g. methyl, ethyl, propyl), alkenyl (eg. vinyl or allyl), alkynyl (eg. ethynyl), cyclopentyl, cyclohexyl, phenyl etc., and n is 0–3, preferably 0 or 1.

The hydrogen silsesquioxane resin includes hydridosiloxane resins of the formula $HSi(OH)_x(OR)_y O_{z/2}$, in which each R is independently an organic group or a substituted organic group which, when bonded to silicon through the oxygen atom, forms a hydrolyzable substituent, x=0–2, y=0–2, z=1–3, x+y+z=3. Examples of R include alkyls such as methyl, ethyl, propyl, butyl, etc., aryls such as phenyl, and alkenyls such as allyl or vinyl. These resins may be fully condensed $(HSiO_{3/2})_n$ or they may be only partially hydrolyzed (i.e., containing some Si—OR) and/or partially condensed (i.e., containing some Si—OH). Although not represented by this structure, these resins may also contain a small number (eg., less than about 10%) of silicon atoms which have either 0 or 2 hydrogen atoms attached thereto or a small number of SiC bonds due to various factors involved in their formation or handling.

The H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of this invention, specific molecular weight fractions of the above H-resins may also be used in this process. Such fractions and methods for their preparation are taught by Hanneman et al. in U.S. Pat. Nos. 5,063,267 and 5,416,190 which are hereby incorporated by reference. A preferred fraction comprises material wherein at least 75% of the polymeric species have a molecular weight above about 1200 and a more preferred fraction comprises material wherein at least 75% of the polymeric species have a number average molecular weight between about 1200 and about 100,000.

The hydrogen silsesquioxane resin may contain a platinum, rhodium or copper catalyst to increase the rate and extent of conversion to silica. Generally, any platinum, rhodium or copper compound or complex which can be solubilized will be functional. For instance, platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The hydrogen silsesquioxane resin may also contain an organic or inorganic peroxide to increase the rate and extent of conversion to silica. Organic and inorganic peroxides useful in the instant invention may be exemplified by, but not limited to barium peroxide, strontium peroxide, calcium peroxide, α, α-bis tertiary peroxydiisopropylbenzene, dicumyl peroxide, benzoyl peroxide and others.

A second type of silicon oxide precursor useful herein includes hydrolyzed or partially hydrolyzed products of compounds or mixtures of compounds of the formula $R^1{}_n Si(OR^1)_{4-n}$ in which $R^1$ and n are as defined above. Some of these materials are commercially available, for example, under the tradename ACCUGLASS (Allied Signal). Specific compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane. After hydrolysis or partial hydrolysis of these compounds, the silicon atoms therein may be bonded to C, OH or $OR^1$ groups, but a substantial portion of the material is believed to be condensed in the form of soluble Si—O—Si resins. Compounds in which x=2 or 3 are generally not used alone as volatile cyclic structures are generated during pyrolysis, but small amounts of said compounds may be cohydrolyzed with other silanes to prepare useful preceramic materials.

The hydrolyzed or partially hydrolyzed products may contain a dispersion of colloidal silica ($SiO_2$). Typically the hydrolyzed or partially hydrolyzed products contain from 10 to 50 weight percent solids in an alcohol-water medium consisting essentially of 10 to 70 weight percent colloidal silica and 30 to 90 weight percent of the hydrolyzate or partial hydrolyzate. The compositions contain sufficient acid to provide a pH in the range of 3.0 to 6.0. These mixtures of colloidal silica and hydrolyzate are commercially available as Silvue® 101 from SDC Coatings, Inc., Anaheim, Calif.

Other ceramic oxide precursors may also be used in combination with any of the above silicon oxide precursors. The ceramic oxide precursors specifically contemplated herein include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed at relatively low temperatures to form ceramic oxides. The use of the ceramic oxide precursors is described in U.S. Pat. Nos. 4,753,855 and 4,973,526, herein incorporated by reference.

The ceramic oxide precursors generally have one or more hydrolyzable groups bonded to the metal or non-metal, depending on the valence of the metal. The number of hydrolyzable groups to be included in these compounds is not critical as long as the compound is soluble or can be dispersed in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, other organic groups bonded to said metal or non-metal through an oxygen such as acetylacetonate or an amino groups. Specific compounds, therefore, include zirconium tetracetylacetonate, titanium dibutoxy diacetylacetonate, aluminum triacetylacetonate, tetraisobutoxy titanium and $Ti(N(CH_3)_2)_4$.

When a ceramic oxide precursor is combined with a silicon oxide precursor, generally it is used in an amount such that the final ceramic contains 0.1 to 30 percent by weight ceramic oxide precursor.

Another example of a preceramic material is silicon carbonitride precursors such as hydridopolysilazane (HPZ) resin, methylpolydisilylazane (MPDZ) resin and polyborosilazane resin (BHPZ). Processes for the production of these materials are described in U.S. Pat. Nos. 4,540,803; 4,340,619 and 4,910,173, respectively, herein incorporated by reference. Other examples of preceramic material include silicon carbide precursors such as polycarbosilanes and silicon nitride precursors such as polysilazanes. Oxygen can be incorporated into the ceramics resulting from the above precursors or the precursors can be converted to silica by pyrolyzing them in an oxygen-containing environment. Mixtures of silicon-containing preceramic materials may also be used.

The preceramic material is used in combination with a flux material. By "flux materials" it is meant materials which melt and react with the preceramic material resulting in a ceramic coating having improved adhesion and toughness. Flux materials useful herein may be exemplified by, but not limited to $B_2O_3$, $PbO_2$, $P_2O_5$, and $Bi_2O_3$.

The amount of flux material used can be varied over a wide range depending on, for example, the quality and characteristics desired in the final coating. Generally the flux materials are used in an amount less than about 90 weight percent of the coating composition to insure that there is enough preceramic material present to bind the filler. It is preferred that the flux material is present in the range of about 1 to 91 volume %, more preferred 5 to 80 volume % based on the volume of preceramic material and flux material.

The flux material may be used alone or in combination with one or more secondary fillers. By the term "filler" it is meant a finely divided solid phase which is distributed within the resin and the final ceramic coating. Fillers useful as secondary filler in this invention include, but are not limited to, optically opaque fillers, radiopaque fillers, luminescent fillers, oxidation resistant fillers, abrasion resistant fillers and magnetic fillers. The secondary filler may include various inorganic and organic fillers, especially inorganic fillers, in a variety of morphologies including, but not limited to powders, particles, flakes, microballoons, and the like.

Optically opaque fillers are fillers that when mixed with the preceramic material render the coating impenetrable to visual light. Optically opaque fillers include, but are not limited to, oxides, nitrides and carbides of silicon and alumina, metals and inorganic pigments. Preferred optically opaque fillers are plasma alumina microballoons having an average size of about 6 microns, silica microballoons having an average size of about 5 to 40 microns, silicon nitride ($Si_3N_4$) powder or whiskers; silicon carbide (SiC) powder or whiskers, aluminum nitride (AlN) powder and black inorganic pigments such as black Ferro® F6331 having an average size of about 0.4 microns.

Radiopaque fillers are fillers that when mixed with the preceramic material render the coating impenetrable to radiation such as x-rays, UV, IR, and visible light as well as sound waves. Radiopaque fillers include, but are not limited to, heavy metals such as tungsten and lead and insoluble salts of heavy metals such as barium, lead, silver, gold, cadmium, antimony, tin, palladium, strontium, tungsten and bismuth. The salts can include, for example, carbonates, sulfates and oxides.

Luminescent fillers are fillers that when mixed with the preceramic material result in a coating that will absorb energy and emit electromagnetic radiation in excess of thermal radiation. The fillers are typically phosphors such as sulfides such as zinc sulfide and cadmium sulfide; selenides;

sulfoselenides; oxysulfides; oxygen dominate phosphors such as borates, aluminates, gallates, silicates and the like; and halide phosphors such as alkali metal halides, alkaline earth halides and oxyhalides. Preferred are sulfides and most preferred is zinc sulfide. The phosphor compounds may also be doped with an activator. Activators include, but are not limited to, manganese, silver and copper; rare earth ions which may be in the form of halides. The activator is generally present in amounts of about 0.1 to 10 mol percent based on the phosphor.

Abrasion resistant fillers are fillers that when mixed with the preceramic material render the coating difficult to remove by a frictional means such as scraping or polishing without damaging the underlying substrate. Abrasion resistant fillers may be exemplified by, but not limited to diamond, titanium nitride (TiN), and fibers of graphite, kevlar, nextel, soffill, Aluminum oxide ($Al_2O_3$), Fiber FP, tungsten carbide, tantalum carbide and others.

Energy resistant fillers are fillers that when mixed with the preceramic material render the coating impenetrable and/or reactive to energy sources such as ozone, UV-ozone, gaseous free radicals and ions, any vapor or liquid borne reactive species and plasmas. Energy resistant fillers may be exemplified by, but not limited to heavy metals such as lead, tungsten, and others.

Magnetic fillers are fillers that when mixed with the precerarnic material render the coating magnetic (i.e. magnetized by a magnetic field; having net magnetic moment). Magnetic fillers may be exemplified by carbon alloys ferrites, iron carbonyl, and alloys of metals such as iron manganese, cobalt, nickel, copper, titanium, tungsten, vanadium, molybdenum, magnesium, aluminum, chromium, zirconium, lead, silicon and zinc such as $Fe_2O_3$, MnZn, NiZn, CuZn and other ferrite materials.

Conductive fillers are fillers that when mixed with the preceramic material render the coating either electrically or thermally conductive. Conductive fillers may be exemplified by gold, silver copper, aluminum, nickel, zinc chromium, cobalt and others.

Other secondary fillers useful herein include synthetic and natural materials such as oxides, nitrides, borides and carbides of various metals and non-metals such as glass, alumina, silica, titanium dioxide, zinc oxide, tungsten oxide and ruthenium oxide; titanates such as potassium titanate and barium titanate; niobates such as lithium niobate and lead niobate; barium sulfate; calcium carbonate; precipitated diatomite; aluminum silicate or other silicates; pigments; metals such as silver, aluminum, or copper; wollastonite; mica; kaolin; clay and talc; high dielectric constant fillers such as titanate, niobate or tungstate salts of metals such as strontium, zirconium, barium, lead, lanthanium, iron, zinc and magnesium such as barium titanate, potassium titanate, lead niobate, lithium titanate, strontium titanate, barium strontium, lead lanthanium zirconium titanate, lead zirconium titanate, and lead tungstate.

The particle size and shape of the above fillers can vary over a wide range (i.e., submicron to 1 mil) depending on factors such as the type of filler, the desired coating thickness and others. There may be only one secondary filler present or a combination of secondary fillers present depending on the protection desired. It is preferred to have a combination of fillers present to provide a wide range of protection from various analytical techniques.

The secondary fillers are generally used in an amount such that the combination of secondary filler and flux material is less than about 90 weight percent of the coating to insure that there is enough preceramic material present to bind the filler. It is preferred that the total amount of flux material and filler be present in the range of about 1 to 91 volume %, more preferred 5 to 80 volume % based on the volume of preceramic material, flux material and secondary filler.

If desired other materials may also be present in the coating composition. For example, adhesion promoters, suspending agents and other optional components may be added. The adhesion promoters may be exemplified by, but not limited to silanes such as glycidoxypropyltrimethoxysilane, mercaptopropyltrimethoxysilane, vinyltriacetoxysilane and others.

The ceramic coating is formed by combining together the preceramic material, the flux material and any optional components and applying the mixture to the surface of the substrate (i.e. electronic device). Preferred substrates are electronic devices, however other substrates such as metals, glass, ceramics, etc. may be used herein. The electronic device can be bare (i.e. no passivation) or the device can have a primary passivation. Such primary passivation can be ceramic coatings such as silica, silicon nitride, silicon carbide, silicon oxynitride, silicon oxycarbide, PSG, BPSG and others deposited by CVD, PVD, PECVD or sol-gel approaches. Primary passivation and methods of depositing are known to those skilled in the art.

The coating composition may be applied in any manner, but a preferred method involves producing a solvent dispersion of the preceramic material, flux material and any optional components and applying the solvent dispersion to the surface of the substrate. Various facilitating means such as stirring and/or heating may be used to disperse the preceramic material and flux material and create a more uniform application material. Solvents which may be used include any agent or mixture of agents which will disperse the preceramic material and flux material to form a homogeneous liquid mixture without affecting the resultant coating. These solvents can include alcohols such as ethyl alcohol or isopropyl alcohol; aromatic hydrocarbons such as benzene or toluene; alkanes such as n-heptane, dodecane or nonane; ketones; esters; glycol ethers; or cyclic dimethylpolysiloxanes. The solvent is present in an amount sufficient to dissolve/disperse the above materials to the concentration desired for application. Typically the coating composition contains from 5 to 99.9 wt % solvent, preferably from 10 to 99 wt %.

Specific methods for application of the solvent dispersion include, but are not limited to spin coating, dip coating, spray coating, flow coating, screen printing or others. The solvent is then allowed to evaporate from the coated substrate resulting in the deposition of the preceramic material and flux material. Any suitable means for evaporation may be used such as simple air drying by exposure to an ambient environment, by the application of a vacuum, or mild heat ($\leq 50°$) or during the early stages of the curing process. It should be noted that when spin coating is used, the additional drying method is minimized as the spinning drives off the solvent.

The preceramic material and flux material are then cured by heating to a sufficient temperature to melt the flux material and convert the preceramic material into a ceramic matrix. When silicon-containing preceramic materials are used the resulting coating is a silica-containing ceramic matrix. By silica-containing ceramic matrix it is meant a hard coating obtained after heating the preceramic material wherein the coating contains both amorphous silica (SiO$_2$) materials as well as amorphous silica-like materials that are not fully free of residual carbon, silanol (Si—OH) and/or hydrogen. Generally, the temperature is in the range of 50° C. to 1000° C. depending on the pyrolysis atmosphere and preceramic material. Preferred temperatures are in the range of 50° C. to 800° C., more preferred are in the range of 50° C. to 450° C. Heating is generally conducted for a time sufficient to ceramify, generally up to 6 hours with less than 3 hours being preferred. The heating may take place at any effective atmospheric pressure from vacuum to superatmospheric and under any effective oxidizing or non-oxidizing gaseous environment such as an inert gas such as N$_2$, Ar, He and others, air, O$_2$, ammonia, amines, moisture, N$_2$O and others. Any method of heating such as the use of a convection oven, rapid thermal processing, hot plate, or radiant of microwave energy may be used herein. The rate of heating is also not critical but is most practical and preferred to heat as rapidly as possible.

It has been found that when the preceramic material contains a flux material the ceramic coating has improved adhesion and increased toughness.

So that those skilled in the art can understand and appreciate this invention taught herein, the following examples are presented, it being understood that these examples should not be used to limit the scope of this invention found in the claims.

EXAMPLE 1

2.11 g of 1.5% polyborosilazane resin (BHPZ) resin in xylene (57% solids), 13.5 g tungsten carbide (0.83 μm) Cerac, 0.5 g tungsten (0.6–0.9 μm) Strem, 0.5 g lead (5.4 μm) Cerac, 3.5 g diamond dust (4–6 μm) Amplex, 0.05 g B$_2$O$_3$ powder Alfa and 1.5 g nonane were mixed for four-20 second periods with a sonic probe. A 4½" square alumina panel (40 mils thick, dried for 30 min. at 150° C.) was coated with the mixture by using a 2 mil drawdown bar. The coated panel was allowed to air dry for 2 hour 35 minutes, then it was pyrolyzed at 400° C. for 1 hour in air. The coating was found to have no cracks at 1000× magnification with a microscope. The coating thickness was 32.6 μm. The pencil hardness was >9H.

EXAMPLE 2

1.7 g of a hydrogen silsesquioxane resin (HSiO$_{3/2}$)$_n$, 13.5 g tungsten carbide (0.83 μm) Cerac, 0.5 g tungsten (0.6–0.9 μm) Strem, 0.5 g lead (5.4 pm) Cerac, 3.5 g diamond dust (4–6 μm) Amplex, 0.06 g B$_2$O$_3$ powder Alfa and 3.0 g nonane were mixed for four-20 second periods with a sonic probe. A 4½" square alumina panel (40 mils thick, dried for 30 min. at 150° C.) was coated with the mixture by using a 2 mil drawdown bar. The coated panel was allowed to air dry for 2 hour 35 minutes, then it was pyrolyzed at 400° C. for 1 hour in air. The coating was found to have no cracks at 1000× magnification with a microscope. The coating thickness was 20.0 μm. The pencil hardness was >9H.

EXAMPLE 3

3.28 g of Silvue® 101, 13.5 g tungsten carbide (0.83 μm) Cerac, 0.5 g tungsten (0.6–0.9 μm) Strem, 0.5 g lead (5.4 μm) Cerac, 3.5 g diamond dust (4–6 μm) Amplex, 0.06 g B$_2$O$_3$ powder Alfa and 1.0 g 2-ethoxyethylacetate were mixed for four-20 second periods with a sonic probe. A 4½" square alumina panel (40 mils thick, dried for 30 min. at 150° C.) was coated with the mixture by using a 2 mil drawdown bar. The coated panel was allowed to air dry for 2 hour 40 minutes, then it was pyrolyzed at 400° C. for 1 hour in air. The coating was found to have no cracks at 1000× magnification with a microscope. The coating thickness was 26.8 μm. The pencil hardness was 5H.

EXAMPLE 4

2.4 g of hydridopolysilazane (HPZ) resin in xylene (55.6% solids), 13.5 g tungsten carbide (0.83 μm) Cerac, 0.5 g tungsten (0.6–0.9 Em) Strem, 0.5 g lead (5.4 μm) Cerac, 3.5 g diamond dust (4–6 μm) Amplex, 0.06 g B$_2$O$_3$ powder Alfa and 1.5 g nonane were mixed for four-20 second periods with a sonic probe. A 4½" square alumina panel (40 mils thick, dried for 30 min. at 150° C.) was coated with the mixture by using a 2 mil drawdown bar. The coated panel was allowed to air dry for 1 hour 40 minutes, then it was pyrolyzed at 400° C. for 1 hour in air. The coating was found to have no cracks at 1000× magnification with a microscope. The coating thickness was 38.3 μm. The pencil hardness was >9H.

What is claimed is:

1. A method of forming a tamper-proof coating on a electronic device comprising:
   applying a coating composition comprising an Si atom containing preceramic material and a flux material onto an electronic device;
   heating the coated electronic device at a temperature of 50° to 800° C. to melt the flux material and convert the preceramic material into a ceramic coating.

2. The method as claimed in claim 1 wherein the coating composition contains from 10 to 99 wt % solvent.

3. The method as claimed in claim 1 wherein the flux material is selected from the group consisting of B$_2$O$_3$, PbO$_2$, P$_2$O$_5$, and Bi$_2$O$_3$.

4. The method as claimed in claim 1 wherein the preceramic material is selected from the group consisting of silicon oxide precursors, silicon carbonitride precursors, silicon carbide precursors and silicon nitride precursors.

5. The method as claimed in claim 4 wherein the preceramic material is a silicon oxide precursor.

6. The method as claimed in 5 wherein the silicon oxide precursor is selected from the group consisting of hydrogen silsesquioxane resin, hydrolyzed or partially hydrolyzed products of compounds or mixtures of compounds having the formula R$^1{}_n$Si(OR$^1$)$_{4-}$wherein each R$^1$ is independently selected from the group consisting of aliphatic, alicyclic and aromatic substituents having from 1 to 20 carbon atoms and n has a value of 0, 1, 2 or 3.

7. The method as claimed in claim 6 wherein the silicon oxide precursor is a hydrogen silsesquioxane resin.

8. The method as claimed in claim 4 wherein the preceramic material is a silicon carbonitride precursor.

9. The method as claimed in claim 1 wherein the preceramic material is selected from the group consisting of hydridopolysilazane resins, methylpolydisilazane resins and polyborosilazane resins.

10. The method as claimed in claim 1 wherein the coating composition contains a filler.

11. The method as claimed in claim 10 wherein the filler is selected from the group consisting of optically opaque fillers, radiopaque fillers, luminescent fillers, abrasion resistant fillers, magnetic fillers, conductive fillers and mixtures thereof.

12. The method as claimed in claim 1 wherein the coated electronic device is heated to a temperature of 50° C. to 450° C.

13. The method as claimed in claim 1 wherein the coating composition is applied to the electronic device by screen printing.

14. The electronic device having a tamper-proof coating thereon produced by the method as claimed in claim 1.

* * * * *